United States Patent [19]
Park et al.

[11] Patent Number: 5,502,336
[45] Date of Patent: Mar. 26, 1996

[54] SEMICONDUCTOR DEVICE AND MANUFACTURING METHOD THEREOF

[75] Inventors: Won-mo Park, Seoul; Jung-hyun Shin; Young-hun Park, both of Suwon, all of Rep. of Korea

[73] Assignee: Samsung Electronics Co., Ltd., Suwon, Rep. of Korea

[21] Appl. No.: 209,475

[22] Filed: Mar. 14, 1994

[30] Foreign Application Priority Data

Mar. 13, 1993 [KR] Rep. of Korea ............... 93-3842

[51] Int. Cl.6 .................................. H01L 21/90
[52] U.S. Cl. .................. 257/754; 257/774; 257/775
[58] Field of Search ........................ 257/377, 775, 257/754, 774, 786, 773, 381, 620, 618

[56] References Cited

U.S. PATENT DOCUMENTS 5,101,262  3/1992  Ariizumi et al. .................. 257/377

FOREIGN PATENT DOCUMENTS 2-237138  9/1990  Japan .................................. 257/775
6-29406   2/1994  Japan .................................. 257/774

*Primary Examiner*—Donald L. Monin, Jr.
*Attorney, Agent, or Firm*—Cushman Darby & Cushman

[57] ABSTRACT

A highly integrated semiconductor device and method for manufacturing the same are disclosed. The device has a self-aligned contact structure for increasing a contact margin upon forming a self-aligned buried contact hole. An oxide film of an upper portion of a gate electrode is chamfered in order to form a self-aligned buried contact hole. Therefore, a self-aligned contact hole can be formed without enhancing the step, and as a result, the step between the cell and the peripheral portion of the cell can be reduced.

10 Claims, 3 Drawing Sheets

SEMICONDUCTOR DEVICE AND MANUFACTURING METHOD THEREOF

BACKGROUND OF THE INVENTION

1. Field of the Invention

The present invention relates to a semiconductor device and manufacturing method thereof, and more particularly, to a method for forming a self-aligned buried contact hole which can increase the contact margin between a gate electrode and a pad electrode.

2. Background of Related Art

For highly integrated semiconductor devices, such as DRAMs, knowledge of insulating film material properties, lithography, cell structure and new wiring materials is required. In a 64 Mega-bit DRAM, the contact hole area must be reduced according to the reduction of the cell size.

A typical 64 Mega-bit DRAM device has a design rule of approximately 0.3 µm to 0.4 µm, even though the contact hole is formed into the general feature size, i.e., 0.5 µm. The peripheral structure, that is, a gate electrode or a bit line, is frequently exposed as a result of a mis-aligned mask. As a result, the gate electrode contacts a storage electrode and a bit line contacts a storage electrode contact, which greatly reduces the reliability of the DRAM.

Several methods have been proposed for reliably minimizing contact hole area without exposing the peripheral structure caused by a mis-aligned mask. One such method calls for forming a self-aligned contact hole.

In a method for forming a self-aligned contact hole, a step forming of the peripheral structure is used to obtain a contact hole without using a mask. The hole size depends on the height of the peripheral structure, thickness of the insulating material where the contact hole is formed, and the etching method. Therefore, forming a self-aligned contact hole is a method suitable for realizing a highly-integrated semiconductor device.

In general, the gate electrodes of the semiconductor device consist of a gate oxide film, polycrystalline silicon and high temperature oxide film. In order to form a self-aligned contact hole, capping oxide film having sufficient thickness is deposited to complement the etching margin when the contact hole is formed in the edge portion of the gate electrode. Thus, a high-step gate electrode can be produced.

FIG. 1 shows an embodiment of a contact hole of the conventional semiconductor memory device formed by the self-aligned method described above. Gate oxide film 11 is formed on a semiconductor substrate 100. Then, a polycrystalline silicon 12 and an insulating oxide film 13 are deposited, and a gate electrode 101(12, 13) is formed by a photo-etching process. Then, a high temperature oxide film 14 is deposited all over the substrate. A photoresist 15 is deposited and a self-aligned buried contact hole is formed by a photo-etching process. Accordingly, when the thickness of oxide films 13 and 14 deposited all over the gate electrode is not sufficient, the edge of the gate electrode is etched faster than the etching for forming the contact hole is performed. As a result, the edge of the gate electrode is exposed inside of the contact hole.

FIG. 2 shows another embodiment of a contact hole of the conventional semiconductor memory device formed by a self-aligned method described above. A gate oxide film 21 is formed on a semiconductor substrate 200. Then, a polycrystalline silicon 22 and a capping oxide film (insulating oxide film) 23 are deposited, and capping oxide film 23 is etched by a photo-etching process. Polycrystalline silicon 22 is isotropically etched, to thereby form a gate electrode 201 (22, 23). A high temperature oxide film 24 is deposited all over the substrate and a photoresist 25 is deposited. Then, a self-aligned buried contact hole is formed by a photo-etching process. Controlling the hole size is difficult when polycrystalline silicon 22 is isotropically etched, and the surface resistance of polycrystalline silicon 22 is increased. As a result, it is difficult to achieve a highly integrated semiconductor device using this method.

SUMMARY OF THE INVENTION

It is an object of the present invention to provide a highly integrated semiconductor device having a self-aligned contact structure with an increased contact margin when a self-aligned buried contact hole is formed.

It is another object of the present invention to provide a method for manufacturing a highly integrated semiconductor device having a self-aligned contact structure in which the contact margin of a self-aligned buried contact hole is increased.

According to the present invention, the thickness of the oxide film of the upper portion of a gate electrode can be made small in order to form a self-aligned buried contact hole. As a result, the self-aligned buried contact hole can be formed without enhancing the step between a cell region and the peripheral region around the cell. The step can be reduced, to thereby make the photo-etching process easier.

In addition, when the gate electrode formed by a polycrystalline silicon is etched using a wet or dry method, the critical dimension of a polycrystalline silicon used for the gate electrode can be controlled and the increase of surface resistance can be minimized.

Thus, according to the present invention, a self-aligned buried contact hole can be formed without the need to enhance a step by controlling the thickness of the oxide film of the upper portion of the gate electrode, i.e. the second polysilicon pattern.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1:
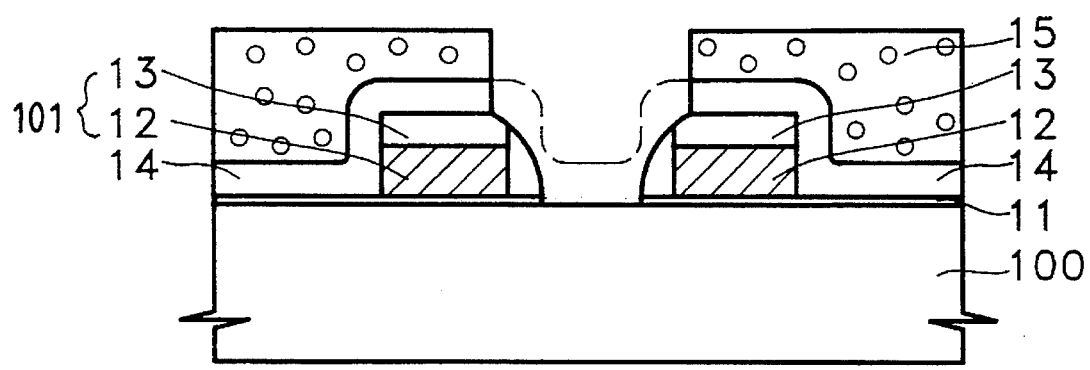
FIG. 1 is a sectional view showing an embodiment of a contact hole of a conventional semiconductor device.
Figure 2:
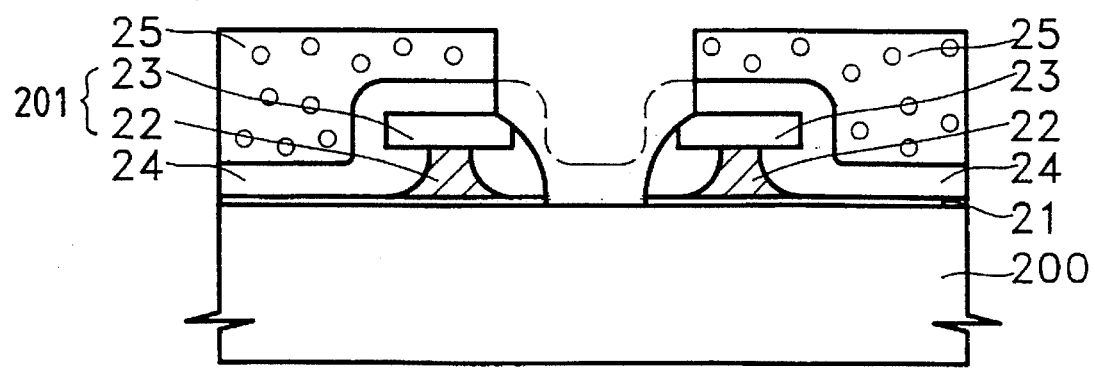
FIG. 2 is a sectional view showing another embodiment of a contact hole of a conventional semiconductor device.
Figure 3:
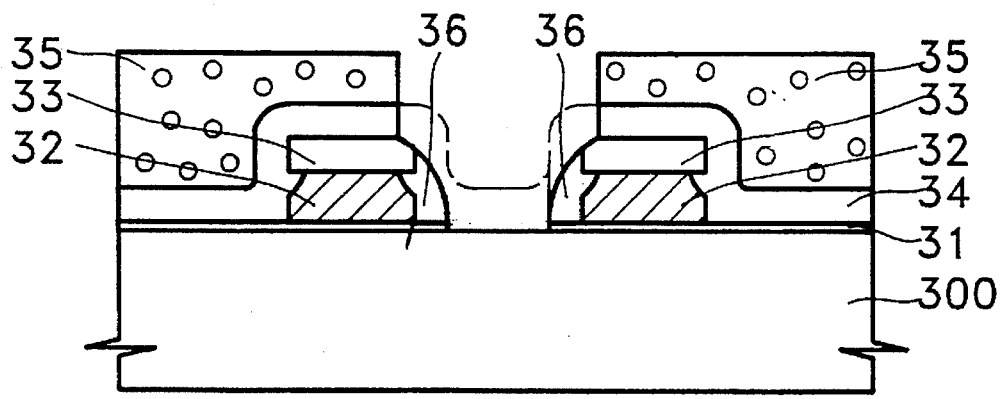
FIG. 3 is a sectional view illustrating a method for forming a contact hole of a semiconductor device according to the present invention.

FIG. 3 is a sectional view illustrating a method for forming a contact hole of a semiconductor device according to the present invention.

First, a gate oxide film 31 is formed on a semiconductor substrate 300. Then, a polycrystalline silicon film 32 and a capping oxide film 33, such as high temperature oxide(HTO) film, are deposited on gate oxide film 31. Then the photoresists are deposited, and the capping oxide film 33 is anisotropically etched using a photoresist pattern (not shown) formed by the photo-etching process. Then, the photoresist pattern is removed, and part of the upper end of polycrystalline silicon film 32 is removed by an isotropic etching using the etched capping oxide film 33 as a mask. Then, the remaining polycrystalline silicon film 32 is anisotropically etched using capping oxide film 33 as a mask, to thereby form a gate electrode 32.

Then, a high temperature oxide film 34 is deposited and photoresist pattern 35 is formed on high temperature oxide film 34. High temperature oxide film 34 and gate oxide film 31 are partially etched using photoresist pattern 35 as an etching mask. As a result, a spacer 36 remains in the side of the gate electrode, thereby forming a contact hole.

Accordingly, the edge of the gate electrode 32 is removed by an isotropic etching process. Therefore, an etching margin of the second high temperature oxide film 34 increases in the weak edge portion when the contact hole is formed. As a result, a reliable self-aligned buried contact hole can be formed.

Figure 4:
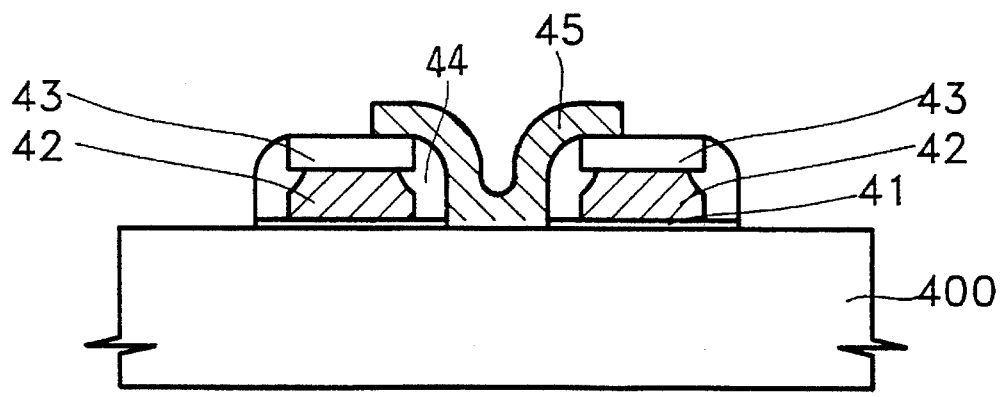
FIG. 4 is a sectional view showing a contact hole of a semiconductor device according to the present invention.

FIG. 4 is a sectional view showing a first embodiment of a contact hole of a semiconductor device according to the present invention.

First, according to the method, a gate oxide film 41 is formed on semiconductor substrate 400 at a thickness of approximately 80Å to 300Å. Then, a polycrystalline silicon film 42 is deposited on gate oxide film 41 at a thickness of 1,000Å to 3,000Å. Then, n-type impurities are introduced into polycrystalline silicon film 42, and a capping oxide film, such as high temperature oxide film 43, is deposited on the upper portion of polycrystalline silicon film 42 at a thickness of 1,000Å to 3,000Å. Then, a photoresist (not shown) is deposited, and the high temperature oxide film is anisotropically etched by applying a photoresist pattern formed by a photo-etching process to form a contact hole. The photoresist is removed, and part of the upper end of polycrystalline silicon film 42 is removed by an amount of 300Å to 1,000Å. This may be achieved by a chemical dry etching or by an anisotropic etching using the etched high temperature oxide film pattern 43 as a mask and using a wet etchant of polycrystalline silicon. Sequentially, a gate electrode is formed by performing anisotropic etching according to methods such as a reactive ion etching, or an electronic cyclotron resonance on the remaining polycrystalline silicon film, using the high temperature oxide film as a mask.

The gate electrode may also be formed as follows. First, the polycrystalline silicon film is isotropically etched and the photoresist pattern is removed. Then the polycrystalline silicon film is anisotropically and sequentially etched to thereby form a gate electrode. In addition, the polycrystalline silicon film may be serially isotropically and anisotropically etched using the photoresist pattern. Then, the photoresist pattern is removed, to thereby form a gate electrode.

Then, high temperature oxide film is deposited at a thickness of 1,500Å to 2,500Å, and a spacer 44 is formed on the sidewall of the gate electrode by a photo-etching process, to thereby form a self-aligned buried contact hole. Then, a polycrystalline silicon is deposited. Then, a pad 45 is formed by photo-etching the polycrystalline silicon, to thereby form an electrode.

FIGS. 5 to 8 are sectional views showing a second embodiment of the present invention and illustrating a method for forming a contact hole of a semiconductor device according to the present invention.

Figure 5:
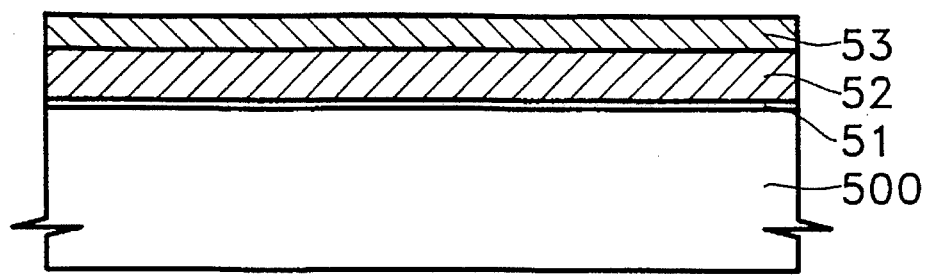
FIGS. 5 to 8 are sectional views showing an embodiment of a method for forming a contact hole of a semiconductor device according to the present invention.

First, referring to FIG. 5, a gate oxide film 51 is formed on a semiconductor substrate 500 and has a thickness of 80Å to 300Å. Then, a polycrystalline silicon film 52 having a thickness of 1,000Å to 3,000Å is deposited on a gate oxide film 51. Then, n-type impurities are introduced on the polycrystalline silicon film, and a capping oxide film 53 is deposited at a thickness of 1,000Å to 2,000Å.

Figure 6:
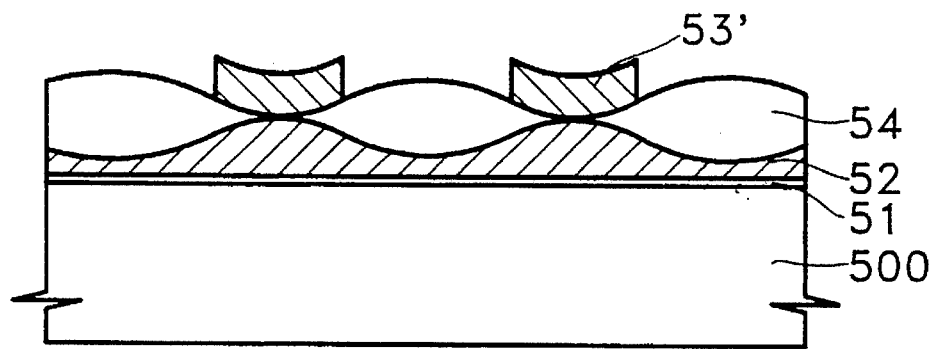

Then, referring to FIG. 6, after a photoresist is deposited, capping oxide film 53, which exists in the region where the contact hole is formed, is removed by applying a photoresist pattern (not shown) formed by a photo-etching process which begins to form the contact hole. Then, the photoresist pattern is removed, and the upper end of polycrystalline silicon film 52 is oxidized using the above etched capping oxide film 53' as a mask. Also, an oxide film 54 having a thickness of 500Å to 2,000Å is formed.

Figure 7:
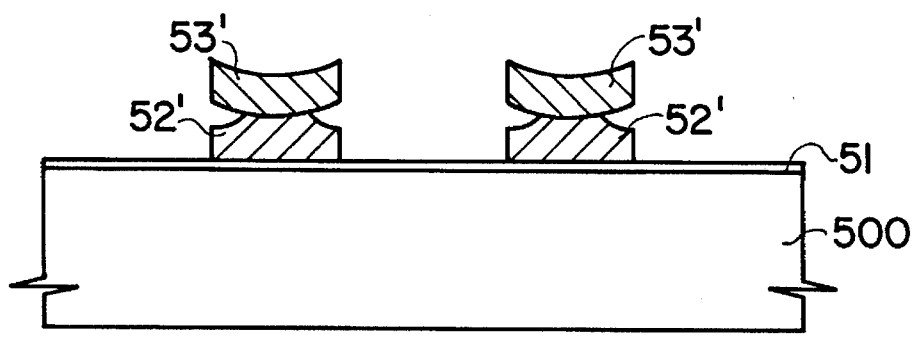

Referring to FIG. 7, oxide film 54 of the upper end of polycrystalline silicon film 52 is removed by a wet etching process. Then, the remaining polycrystalline silicon film 52 is etched using capping oxide film pattern 53' as an etching mask, to thereby form gate electrodes 52'. Chamfer-shaped gate electrode 52' is formed by an isotropical etching using a wet etchant of polycrystalline silicon or dry etching.

Figure 8:
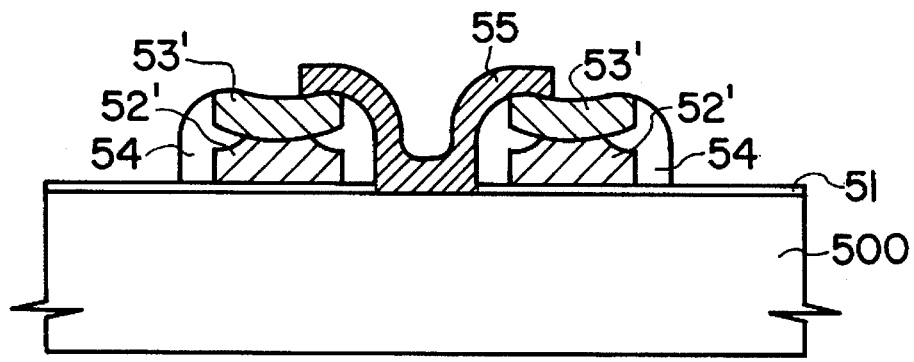

Referring to FIG. 8, a high temperature oxide film having a thickness of 1,500Å to 2,500Å is deposited on the resultant structure where the gate electrode is formed. A spacer 54' is formed on the sidewall of a gate electrode by a photo-etching process, to thereby form a self-aligned buried contact hole. Then, a polycrystalline silicon film is deposited and etched by a photo-etching process to form a pad electrode 55. As a result, pad electrode 55 is formed.

According to the first and second embodiments, the pad electrode is connected to the substrate. But, the pad electrode can be connected to a low conductive film, such as polycrystalline silicon film.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A semiconductor device, comprising:

a semiconductor substrate;

a first insulating film pattern on said semiconductor substrate;

a first conductive film pattern formed on said first insulating film pattern and having an upper edge, the upper edge having a chamfered upper edge and a lower edge substantially perpendicular to an upper surface of said semiconductor substrate;

a second insulating film pattern formed on said first conductive film pattern;

a spacer formed on said upper edge and said lower edge of said first conductive film pattern, said spacer forming a contact hole exposing said semiconductor substrate; and a second conductive film pattern in contact with said semiconductor substrate in said contact hole;

wherein said chamfered upper edge of said first conductive film pattern provides an enlarged thickness in said spacer so as to protect said first conductive film pattern from exposure in said contact hole.

2. A semiconductor device according to claim 1, wherein:

said first conductive film pattern and said second conductive film pattern are each comprised of impurity-doped polysilicon.

3. A semiconductor device according to claim 1, wherein:

said first insulating film pattern has a thickness of approximately 80Å to 300Å.

4. A semiconductor device according to claim 1, wherein:

said first conductive film pattern has a thickness of 1000Å to 3000Å.

5. A semiconductor device according to claim 1, wherein:

said second insulating film pattern has a thickness of 1000Å to 3000Å.

6. A semiconductor device according to claim 1, wherein:

said upper edge of said first conductive film pattern is chamfered to a thickness of 300Å to 1000Å.

7. A semiconductor device according to claim 1, wherein:

said second insulating film pattern has a thickness of 1000Å to 2000Å.

8. A semiconductor device, comprising:

a semiconductor substrate;

a first insulating film pattern having a thickness of approximately 80Å to 300Å on said semiconductor substrate;

a first conductive film pattern having a thickness of 1000Å to 3000Å on said first insulating film pattern, said first conductive film having a chamfered upper edge having a chamfered thickness of 300Å to 1000Å, and said first conductive film having a lower edge substantially perpendicular to an upper surface of said semiconductor substrate;

a second insulating film pattern having a thickness of 1000Å to 3000Å on said first conductive film pattern;

a spacer formed on said chamfered upper edge and lower edge of said first conductive film pattern, said spacer forming a contact hole exposing said semiconductor substrate; and a second conductive film pattern in contact with said semiconductor substrate in said contact hole;

wherein said chamfered upper edge of said first conductive film pattern provides an enlarged thickness in said spacer so as to protect said first conductive film pattern from exposure in said contact hole.

9. A semiconductor device according to claim 8, wherein:

said first conductive film pattern and said second conductive film pattern are each comprised of impurity-doped polysilicon.

10. A semiconductor device according to claim 8, wherein:

said second insulating film pattern has a thickness of 1000Å to 2000Å.

* * * * *